United States Patent
Robello et al.

(10) Patent No.: US 9,298,088 B2
(45) Date of Patent: Mar. 29, 2016

(54) FLUORINATED PHOTOPOLYMER WITH FLUORINATED SENSITIZER

(71) Applicant: Orthogonal, Inc., Rochester, NY (US)

(72) Inventors: Douglas Robert Robello, Webster, NY (US); Charles Warren Wright, Fairport, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 14/335,476

(22) Filed: Jul. 18, 2014

(65) Prior Publication Data

US 2015/0030982 A1   Jan. 29, 2015

Related U.S. Application Data

(60) Provisional application No. 61/857,890, filed on Jul. 24, 2013.

(51) Int. Cl.

| | | |
|---|---|---|
| *G03F 7/004* | (2006.01) | |
| *G03F 7/40* | (2006.01) | |
| *G03F 7/027* | (2006.01) | |
| *G03F 7/038* | (2006.01) | |
| *G03F 7/20* | (2006.01) | |
| *G03F 7/30* | (2006.01) | |
| *G03F 7/32* | (2006.01) | |
| *H01L 21/027* | (2006.01) | |

(Continued)

(52) U.S. Cl.
CPC .............. *G03F 7/027* (2013.01); *C08F 220/18* (2013.01); *C08F 220/24* (2013.01); *C08F 222/18* (2013.01); *G03F 7/038* (2013.01); *G03F 7/0388* (2013.01); *G03F 7/2002* (2013.01); *G03F 7/30* (2013.01); *G03F 7/32* (2013.01); *G03F 7/40* (2013.01); *H01L 21/0274* (2013.01)

(58) Field of Classification Search
CPC .......... G03F 7/0388; G03F 7/30; G03F 7/32; G03F 7/40; G03F 7/0045; G03F 7/0046; C08F 220/18; C08F 220/24; C08F 220/22; C08F 222/18; C08F 2222/185; H01L 21/0274
USPC .............. 430/270.1, 322, 325, 329, 330, 331, 430/913, 926
See application file for complete search history.

(56) References Cited

U.S. PATENT DOCUMENTS 4,647,689 A    3/1987   Micinski
4,965,171 A *  10/1990  Kawabata et al. ......... 430/288.1
(Continued)

FOREIGN PATENT DOCUMENTS

EP        0 430 722 A2    12/1990
WO    WO 2012/148884 A2   4/2012

OTHER PUBLICATIONS

U.S. Appl. No. 14/291,692, filed May 30, 2014.
(Continued)

*Primary Examiner* — Amanda C Walke
(74) *Attorney, Agent, or Firm* — Merchant & Gould P.C.

(57) ABSTRACT

A photosensitive composition useful for fabricating organic electronic devices comprises a fluorinated solvent a fluorinated sensitizing dye and a copolymer. The copolymer comprises at least two distinct repeating units, including a first repeating unit having a fluorine-containing group and a second repeating unit having a solubility-altering reactive group. The presence of the fluorinated sensitizing dye improves photosensitivity.

19 Claims, 1 Drawing Sheet

(51) Int. Cl.
*C08F 220/18* (2006.01)
*C08F 220/24* (2006.01)
*C08F 222/18* (2006.01)

(56) References Cited

U.S. PATENT DOCUMENTS

| | | | |
|---|---|---|---|
| 5,250,395 A | 10/1993 | Allen et al. | |
| 5,286,803 A | 2/1994 | Lindsay et al. | |
| 5,650,456 A | 7/1997 | Yun et al. | |
| 5,701,055 A | 12/1997 | Nagayama et al. | |
| 5,942,372 A * | 8/1999 | West et al. | 430/281.1 |
| 6,136,498 A | 10/2000 | Jagannathan et al. | |
| 6,229,055 B1 * | 5/2001 | Klaubert et al. | 568/765 |
| 6,693,296 B1 | 2/2004 | Tyan | |
| 7,632,630 B2 | 12/2009 | Mori et al. | |
| 7,892,720 B2 | 2/2011 | Eriguchi et al. | |
| 8,338,529 B2 | 12/2012 | Hoshino et al. | |
| 8,551,676 B2 * | 10/2013 | Nakashima et al. | 430/7 |
| 2002/0161068 A1 | 10/2002 | Watanabe et al. | |
| 2003/0175002 A1 | 9/2003 | Andrews et al. | |
| 2003/0215735 A1 * | 11/2003 | Wheland et al. | 430/270.1 |
| 2005/0196969 A1 | 9/2005 | Gunner et al. | |
| 2009/0130591 A1 | 5/2009 | Yao et al. | |
| 2009/0263588 A1 | 10/2009 | Kakino | |
| 2011/0159252 A1 * | 6/2011 | Ober et al. | 428/195.1 |
| 2012/0301828 A1 | 11/2012 | Tachibana et al. | |
| 2012/0305897 A1 * | 12/2012 | Ober et al. | 257/40 |
| 2013/0108960 A1 | 5/2013 | Hatakeyama et al. | |
| 2014/0205818 A1 * | 7/2014 | Schwartz et al. | 428/201 |
| 2015/0140729 A1 * | 5/2015 | Ferro et al. | 438/99 |

OTHER PUBLICATIONS

U.S. Appl. No. 61/857,890, filed Jul. 24, 2013.

* cited by examiner

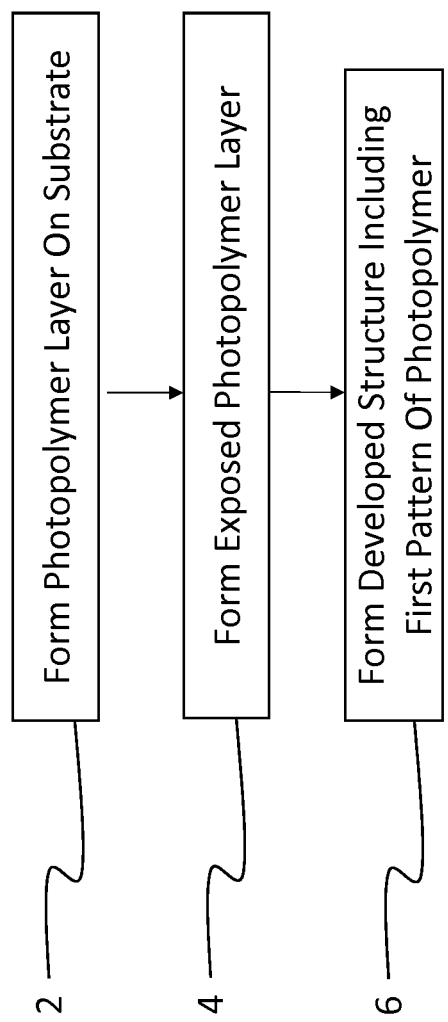

FLUORINATED PHOTOPOLYMER WITH FLUORINATED SENSITIZER

CROSS REFERENCE TO RELATED APPLICATIONS

The present application claims the benefit of U.S. Provisional Application No. 61/857,890, filed Jul. 24, 2013, which is incorporated herein by reference.

STATEMENT REGARDING FEDERALLY-SPONSORED RESEARCH OR DEVELOPMENT

This invention was made with Government support under SBIR Phase II Grant No. 1230454 awarded by the National Science Foundation (NSF). The government may have certain rights in the invention.

BACKGROUND

1. Field of the Invention

The present invention relates to fluorinated photopolymers having solubility-altering reactive groups and fluorinated sensitizers. Such photopolymers are particularly useful in organic electronic and bioelectronic devices.

2. Discussion of Related Art

Photocurable and photo-patternable polymeric compositions have many possible commercial applications. They can be used as photoresists, dielectrics, insulators, semiconductors, encapsulants, inert overcoats, water or oil repellent layers, light blocking or emitting layers, paints, printing inks and the like. Certain photocurable polymeric compositions are of particular use in the fabrication of organic electronic devices, including bioelectronic devices.

Organic electronic devices offer certain performance and price advantages relative to conventional inorganic-based devices. As such, there has been much commercial interest in the use of organic materials in electronic device fabrication. Specifically, organic materials such as conductive polymers can be used to manufacture devices that have reduced weight and drastically greater mechanical flexibility compared to conventional electronic devices based on metals and silicon. Further, devices based on organic materials are likely to be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials are expected to be less expensive than devices based on conventional inorganic materials.

One problem facing bioelectronic and organic electronic devices is that the materials and patterning processes used for conventional inorganic electronics are often not compatible with biological and organic electronic materials. Thus, new patterning materials and processes are needed.

For example, although the use of photoresists is routine in the patterning of traditional electronic devices based on inorganic materials, photolithographic patterning has been difficult when applied to biological or organic electronic materials. Specifically, biological and organic electronic materials are often much less resistant to the solvents that are used for conventional photolithography, as well as to the intense light sources that are used in these processes, with the result that conventional lithographic solvents and processes tend to degrade bioelectronic and organic electronic devices. Although there have been various attempts to overcome these problems, e.g., by ink jet printing or shadow mask deposition, these alternative methods do not produce the same results as would be obtained with successful photolithography. Specifically, neither ink jet printing nor shadow mask deposition can achieve the fine pattern resolutions that can be obtained by conventional lithography.

US 2011/0159252 discloses a useful method for patterning organic electronic materials by an "orthogonal" process that uses fluorinated solvents and fluorinated photoresists. The fluorinated solvents have very low interaction with organic electronic materials Although the orthogonal process has made good progress, these fluorinated systems do not always have sufficient sensitivity to typical exposing radiation, especially in the range of 300 to 450 nm. Conventional photoresist compositions may include a photosensitizing additive, commonly referred to as a sensitizer or sensitizing dye, to increase the photosensitivity of the photoresist at a particular wavelength. By varying the amount of sensitizer added to the photoresist, the photo speed and spectral sensitivity of the system can be modulated. An important technical limitation of most existing sensitizers is that they are not highly soluble in fluorinated coating solvents or fluorinated developing solutions. Consequently, the concentration of sensitizer that can be employed in fluorinated photoresist composition is very limited and development can leave behind a residue of the sensitizer.

Electronic devices may require an insulating or dielectric layer (e.g., $SiO_2$ or spin-coated polymers). Here again, typical insulating or dielectric materials are often not compatible with sensitive bioelectronic and organic electronic material layers.

In light of the above, there is a need to provide a more effective sensitization of photopolymers, and in particular, photopolymers that are compatible in the manufacture of bioelectronic and organic electronic devices.

SUMMARY

In accordance with an embodiment of the present disclosure, a composition comprises: a fluorinated solvent; a fluorinated sensitizing dye; and a copolymer comprising at least two distinct repeating units, including a first repeating unit having a fluorine-containing group and a second repeating unit having a solubility-altering reactive group.

In accordance with another embodiment of the present disclosure, a method of patterning a device comprises: forming a photopolymer layer on a device substrate, the photopolymer layer including a fluorinated sensitizing dye and a copolymer, wherein the copolymer comprises at least two distinct repeating units, including a first repeating unit having a fluorine-containing group and a second repeating unit having a solubility-altering reactive group, wherein the total fluorine content of the copolymer is in a range of 15 to 60% by weight; exposing the photopolymer layer to patterned light in a wavelength range of 300 to 450 nm to form an exposed photopolymer layer; and contacting the exposed photopolymer layer with a developing agent to remove a portion of the exposed photopolymer layer in accordance with the patterned light, thereby forming a developed structure having a first pattern of photopolymer covering the substrate and a complementary second pattern of uncovered substrate corresponding to the removed portion of photopolymer, the developing agent comprising at least 50% by volume of a fluorinated solvent.

In an embodiment, the compositions of the present disclosure have improved photosensitivity relative similar compositions without the fluorinated sensitizing dye, thereby requiring less exposure energy. When used to pattern other light-sensitive materials, the reduced light exposure may reduce possible degradation. In an embodiment, the improved light sensitivity may further enable reducing the amount of photoacid generator.

BRIEF DESCRIPTION OF DRAWINGS

FIG. 1 is a flow chart depicting the steps in an embodiment of the present invention.

DETAILED DESCRIPTION

A photosensitive composition (also referred to herein as a photopolymer composition) includes a light-sensitive material that can be coated or applied in some way to produce a photocurable film, e.g., a photo-patternable film. In an embodiment, photopolymers of the present disclosure may be used as a photoresist to pattern a layer of some useful material in a device, e.g., a multilayer electronic device, and the photopolymer may optionally be removed (stripped). In an embodiment, photopolymers of the present disclosure may remain as part of a device and be used to form, e.g., a pattered a dielectric film or a water and/or oil repellent structure. An embodiment of the present disclosure is directed to improved fluorinated photopolymer compositions that include a fluorinated sensitizing dye that is not attached directly to the polymer. The photopolymer is particularly suited for coating and developing using fluorinated solvents. The solvents for the fluorinated photopolymer solution, the optional developing solution and optional stripping solution are each chosen to have low interaction with other material layers that are not intended to be dissolved or otherwise damaged. Such solvents are collectively termed "orthogonal" solvents. This can be tested by, for example, immersion of a device comprising the material layer of interest into the solvent or solution prior to operation. The solvent is orthogonal if there is no serious reduction in the functioning of the device. Unless otherwise noted, the term "solution" is used broadly herein to mean any flowable material. Examples of "solutions" include, but are not limited to; single solvent liquids; homogeneous mixtures of a solvent with one or more other solvents, with one or more solutes, and combinations thereof; and heterogeneous or multi-phase mixtures such as emulsions, dispersions and the like.

Certain embodiments disclosed in the present disclosure are particularly suited to devices using solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronic materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

The photopolymer compositions of the present disclosure are provided in a coating solution that typically includes a fluorinated solvent. In an embodiment, one or more fluorinated solvents comprise at least 50% by weight of the photopolymer composition. If a deposited layer is intended to be photo-patterned, a pattern-exposed photopolymer layer can be developed using a developing solution capable of discriminating between exposed and unexposed areas. In an embodiment, the developing solution includes at least 50% by volume of a fluorinated solvent, preferably at least 90% by volume. Similarly, a developed (patterned) photopolymer layer can optionally be stripped using a stripping solution capable of dissolving or lifting off the exposed photopolymer. In an embodiment, the stripping solution includes at least 50% by volume of a fluorinated solvent, preferably at least 90% by volume. Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (PFCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE 7600 aka Novec™ 7600), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxy)benzene (HFE-978m), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE60-C3).

The fluorinated photopolymer composition of the present disclosure includes a fluorinated solvent, a fluorinated sensitizing dye and a fluorinated photopolymer material. The fluorinated sensitizing dye is not attached to the fluorinated photopolymer material. In an embodiment, the fluorinated photopolymer material includes a copolymer comprising at least two distinct repeating units, including a first repeating unit having a fluorine-containing group and a second repeating unit having a solubility-altering reactive group. In an embodiment, the copolymer has a total fluorine content in a range of 15 to 60% by weight, alternatively 30 to 60% by weight, or alternatively 35 to 55% by weight. The term copolymer includes oligomers in addition to higher MW polymers. In an embodiment, the MW of the photopolymer is at least 2500 daltons, or in another embodiment at least 5000 daltons, or in another embodiment, at least 10,000 daltons. The copolymer is suitably a random copolymer, but other copolymer types can be used, e.g., block copolymers, alternating copolymers, and periodic copolymers. The term "repeating unit" herein is used broadly herein and simply means that there is more than one unit. The term is not intended to convey that there is necessarily any particular order or structure with respect to the other repeating units unless specified otherwise. When a repeating unit represents a low mol % of the combined repeating units, there may be only one unit on a polymer chain. The copolymer may be optionally blended with one or more other polymers, preferably other fluorine-containing polymers. The total fluorine content of a blended polymer may suitably be in a range of 15 to 60% by weight, alternatively 30 to 60% by weight, or alternatively 35 to 55% by weight.

In an embodiment, at least one of the two specified repeat units is formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. Similarly, a precursor polymer containing an alcohol can be reacted with a suitably derivatized glycidyl moiety to form an acid-catalyzed cross-linkable (epoxy-containing) repeating unit as the solubility-altering reactive group. In another example, a polymer containing a suitable leaving group such as primary halide can be reacted with an appropriate compound bearing a phenol moiety to form the desired repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the first and second repeating units are formed directly by polymerization of two (or more) appropriate monomers each having a polymerizable group, rather than by attachment to an intermediate polymer. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl acetates. Although many of the embodiments below refer to polymerizable monomers, analogous structures and ranges are contemplated and within the scope of the present disclosure wherein one or more of the repeating units are formed instead by attachment to an intermediate polymer.

In an embodiment, the fluorinated photopolymer material includes a copolymer formed at least from a first monomer having a fluorine-containing group and a second monomer having a solubility-altering reactive group. The first monomer is one capable of being copolymerized with the second monomer and has at least one fluorine-containing group. In an embodiment, at least 70% of the fluorine content of the copolymer (by weight) is derived from the first monomer. In another embodiment, at least 85% of the fluorine content of the copolymer (by weight) is derived from the first monomer. Although the other monomer(s) may include fluorine, and there can be performance advantages when they do, some fluorine-containing substituents can be expensive. In certain embodiments, therefore, it is useful from a cost standpoint to rely on the first monomer for the fluorine content, rather than also preparing additional fluorinated monomers if their substituents have high cost. In an embodiment, the first monomer is provided in a range of 30 to 90% by weight relative to the polymer, alternatively 50 to 90%, or alternatively 60 to 80%.

The first monomer includes a polymerizable group and a fluorine-containing group. Some non-limiting examples of useful polymerizable groups include acrylates (e.g. acrylate, methacrylate, cyanoacrylate and the like), acrylamides, vinylenes (e.g., styrenes), vinyl ethers and vinyl acetates. The fluorine-containing group of the first monomer or the first repeating unit is preferably an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. Throughout this disclosure, unless otherwise specified, any use of the term alkyl includes straight-chain, branched and cyclo alkyls. In an embodiment, the first monomer does not contain protic or charged substituents, such as hydroxy, carboxylic acid, sulfonic acid or the like.

In a preferred embodiment, the first monomer has a structure according to formula (1):

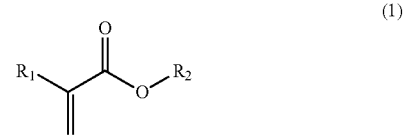

(1)

In formula (1), $R_1$ represents a hydrogen atom, a cyano group, a methyl group or an ethyl group. $R_2$ represents a fluorine-containing group, for example, a substituted or unsubstituted alkyl group having at least 5 fluorine atoms, preferably at least 10 fluorine atoms. In an embodiment, the alkyl group is a hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter would be 1H,1H,2H,2H-perfluorooctyl (aka 2-perfluorohexyl ethyl), and a particularly useful first monomer includes 1H,1H,2H,2H-perfluorooctyl methacrylate ("FOMA") and similar materials.

Multiple "first repeating units" or "first monomers" may be used in a photopolymer, i.e., the polymer may include more than just one type of fluorine-containing group or fluorine-containing first monomer.

The second monomer is one capable of being copolymerized with the first monomer. The second monomer includes a polymerizable group and a solubility-altering reactive group. Some non-limiting examples of useful polymerizable groups include those described for the first monomer.

In an embodiment, the solubility-altering reactive group of the second monomer or second repeating unit is an acid-forming precursor group. Upon exposure to light, the acid-forming precursor group generates a polymer-bound acid group, e.g., a carboxylic or sulfonic acid. This drastically changes its solubility relative to the unexposed regions thereby allowing development of an image with the appropriate solvent. In an embodiment, the developing agent includes a fluorinated solvent that selectively dissolves unexposed areas. In an alternative embodiment, the developing agent includes a polar solvent that selectively dissolves the exposed areas. In an embodiment, a carboxylic acid-forming precursor is provided from a monomer in a weight percentage range of 10 to 60% relative to the copolymer.

One class of acid-forming precursor groups includes the non-chemically amplified type (i.e., non-acid catalyzed). An example of a second monomer with such a group is 2-nitrobenzyl methacrylate. With this class, the fluorinated sensitizing dye in the composition absorbs light and forms an excited state capable of directly sensitizing or otherwise initiating the de-protection of acid-forming precursor groups. Unlike chemically amplified formulations that rely on generation of an acid (see below), non-chemically amplified photopolymers may sometimes be preferred when a photopolymer is used in contact with an acid-sensitive material. Some active organic materials can be sensitive to the presence of an acid.

A second class of acid-forming precursor groups includes the chemically amplified type. This typically requires a photo-acid generator (PAG) to be added to the photopolymer composition, e.g. as a small molecule additive to the solution or alternatively incorporated into the photopolymer. The fluorinated sensitizing dye in the composition absorbs light and forms an excited state capable of reacting with a PAG to generate an acid. The acid catalyzes the de-protection of acid-labile protecting groups of the acid-forming precursor. In some embodiments, chemically amplified photopolymers can be particularly desirable since they enable the exposing step to be performed through the application of relatively low dose UV light exposure (typically under 500 mJ/cm² or preferably under 100 mJ/cm²). This is advantageous since some active organic materials useful in applications to which the present disclosure pertains may decompose in the presence of UV light, and therefore, reduction of the energy during this step permits the photopolymer to be exposed without causing significant damage to underlying active organic layers. Also, decreased light exposure may be obtained by shorter exposure duration, improving the manufacturing throughput of the desired devices.

Examples of acid-forming precursor groups that yield a carboxylic acid include, but are not limited to: A) esters capable of forming, or rearranging to, a tertiary cation, e.g., t-butyl ester, 2-methyl-2-adamantyl ester, 1-ethylcyclopentyl ester and 1-ethylcyclohexyl ester; B) esters of lactone, e.g., γ-butyrolactone-3-yl, γ-butyrolactone-2-yl, mevalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters; E) alpha-cyclic ether esters; and F) MEEMA (methoxy ethoxy ethyl methacrylate) and other esters which are easily hydrolyzable because of anchimeric assistance. In an embodiment, a second monomer comprises an acrylate-based polymerizable group and a tertiary alkyl ester acid-forming precursor group, e.g., t-butyl methacrylate (TBMA) or 1-ethylcyclopentyl methacrylate ("ECPMA").

In an embodiment, the solubility-altering reactive group is an hydroxyl-forming precursor group. The hydroxyl-forming precursor includes an acid-labile protecting group and the photopolymer composition typically includes a PAG compound and operates as a "chemically amplified" type of system. Upon exposure to light, the sensitizing dye interacts with a PAG compound to generate an acid, which in turn, catalyzes the deprotection of the hydroxyl-forming precursor group, thereby forming a polymer-bound alcohol (hydroxyl group). This significantly changes its solubility relative to the unexposed regions thereby allowing development of an image with the appropriate solvent (typically fluorinated). In an embodiment, the developing solution includes a fluorinated solvent that selectively dissolves unexposed areas. In an alternative embodiment, the developing solution includes a polar solvent that selectively dissolves the exposed areas.

In an embodiment, the hydroxyl-forming precursor has a structure according to formula (2):

wherein $R_5$ is a carbon atom that forms part of the second repeating unit or second monomer, and $R_{10}$ is an acid-labile protecting group. Non-limiting examples of useful acid-labile protecting groups ($R_{10}$) include those of formula (AL-1), acetal groups of the formula (AL-2), tertiary alkyl groups of the formula (AL-3) and silane groups of the formula (AL-4). The asterisk (*) indicates where the group is linked to the $R_5$—O— group from formula (2).

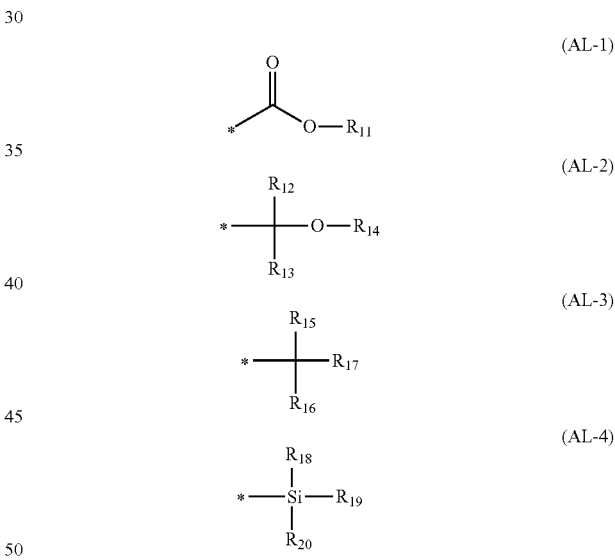

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

AL-1-1

-continued

AL-1-2
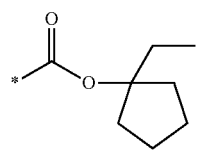

AL-1-3
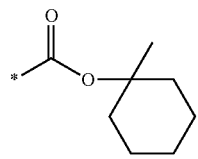

AL-1-4
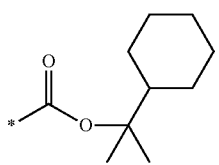

AL-1-5
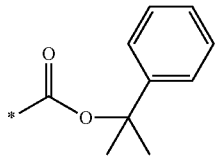

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen, or a monovalent hydrocarbon group, typically a straight, branched or cyclic alkyl group, of 1 to 20 carbon atoms that may optionally be substituted. Some representative examples of formula (AL-2) include:

AL-2-1
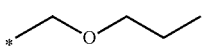

AL-2-2
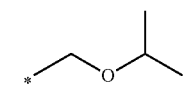

AL-2-3
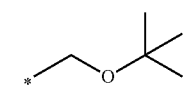

AL-2-4
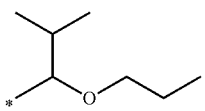

AL-2-5
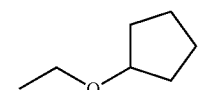

AL-2-6
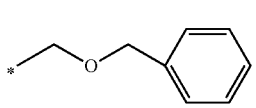

-continued

AL-2-7
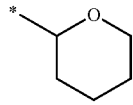

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1
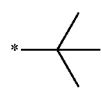

AL-3-2
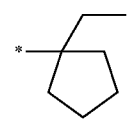

AL-3-3

AL-3-4
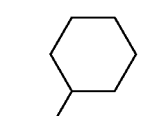

AL-3-5
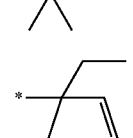

AL-3-6
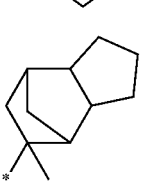

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In an embodiment, the solubility-altering reactive group is a cross-linkable group, including but not limited to, an acid-catalyzed cross-linkable group. Examples of acid-catalyzed cross-linkable groups include, but are not limited to, cyclic ether groups and vinyloxy groups. In an embodiment, the cyclic ether is an epoxide or an oxetane. Acid-catalyzed cross-linkable photopolymers typically require a photo-acid generator (PAG) to be added to the photopolymer composition, e.g. as a small molecule additive to the solution or alternatively incorporated into the photopolymer. Upon exposure to light, the sensitizing dye interacts with a PAG compound to generate an acid, which in turn, catalyzes the cross-linking of the acid-catalyzed cross-linkable groups. This significantly changes its solubility relative to the unexposed regions thereby allowing development of an image with the appropriate developing agent (for example, one that includes a fluorinated solvent). Usually, cross-linking reduces solubility. In an embodiment, the developing agent includes a fluorinated solvent that selectively dissolves unexposed areas.

Some non-limiting examples of some acid-catalyzed cross-linkable groups include the following wherein (*) refers to an attachment site to the polymer or the polymerizable group of a monomer:

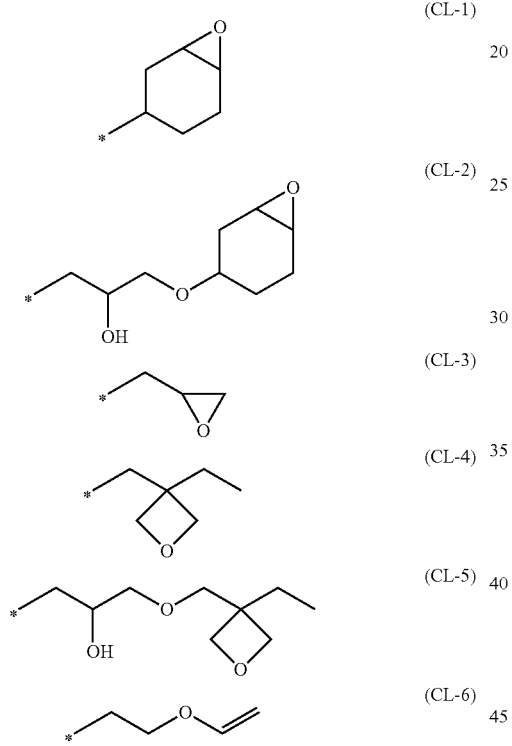

In an embodiment, the solubility-altering reactive groups are ones that, when the photopolymer composition or layer is exposed to light, undergo a bond-breaking reaction to form a material with higher solubility in fluorinated solvents. For example, the solubility-altering reactive groups could be cross-linked and the links are broken upon exposure to light thereby forming lower molecular weight materials. In this embodiment, a fluorinated solvent may be selected to selectively remove exposed areas, thereby acting as a positive photopolymer system.

Multiple "second repeating units" or "second monomers" may be used in a photopolymer, i.e., the polymer may include more than just one type of solubility-altering reactive group.

It is common in photolithography to etch patterns into layers using a "dry etchant" with the patterned photopolymer acting as an etch barrier. Herein, the term "dry etchant" is used broadly and refers to any useful gaseous material possessing energy sufficient to etch (remove) a target material. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations.

It can be advantageous, therefore, for the photopolymer to have reasonable resistance to the dry etch to ensure good pattern transfer to the underlying layer. The fluorinated photopolymer may optionally comprise a repeating unit having a dry-etch-resistant group that includes at least one dry-etch-resistant atom having an atomic weight of at least 24. In an embodiment, the dry-etch-resistant atom is Si, Ti, Ge, Al, Zr, or Sn. The dry-etch-resistant group may optionally be formed from a polymerizable monomer, e.g., one that has an organosilane, a siloxane, silazane or metalloxane group. In a preferred embodiment, the dry-etch-resistant group includes a silane or siloxane group. In certain embodiments, when a fluorinated photopolymer layer is subjected to an etching gas comprising oxygen radicals, the dry-etch-resistant group will break down to form a layer of oxide, e.g., silicon oxide (SiOx) or other metal oxide. This layer of oxide reduces the etch rate of the remaining underlying polymer and can be used to form a dielectric structure having a surface region comprising a higher density of dry-etch-resistant atoms than an interior region.

Some non-limiting examples of polymerizable monomers having a dry-etch-resistant group include those that have a structure according to formula (3):

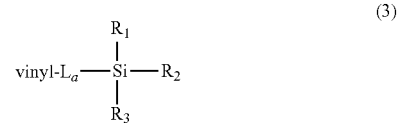

In formula (3), $R_1$ through $R_3$ are independently selected alkyl, aryl, alkoxy, aryloxy, siloxy groups, a=0 or 1, L is an optional linking group connecting a polymerizable vinyl moiety to the Si atom. The vinyl moiety may be have additional substitution so long as it is still readily polymerizable, e.g., alkyl, fluoro or cyano groups, or it may be part of a ring structure, e.g., as in norbornene or adamantane. A few non-limiting examples of such structures include:

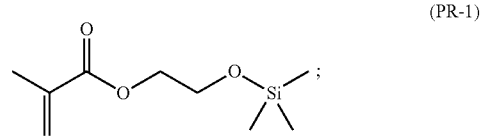

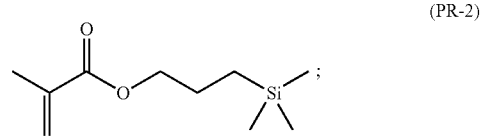

-continued

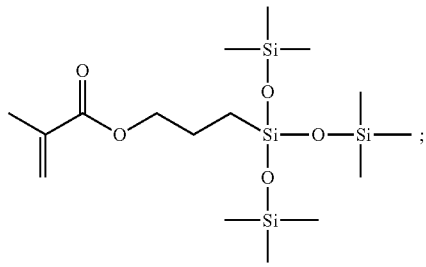
(PR-3)

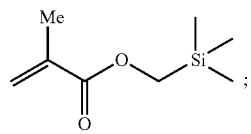
(PR-4)

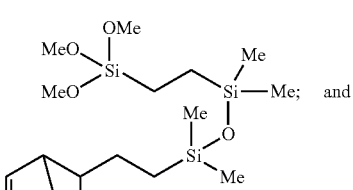
(PR-5)

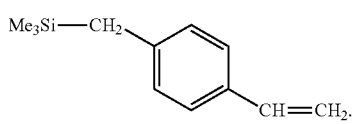
(PR-6)

In an embodiment, the mole ratio of the dry-etch-resistant repeating unit relative to all other repeating units combined is in a range of 0.1 to 1.

The photopolymer may optionally further include an attached sensitizing dye, e.g., as disclosed in co-pending U.S. application Ser. No. 14/291,692, the contents of which are incorporated by reference. For example, the photopolymer may include an attached sensitizing dye that is sensitive to i-line radiation, whereas the unattached fluorinated sensitizing dye of the present disclosure provides sensitivity to g-line radiation (or vice versa) thereby broadening the spectral sensitivity and scope of useful exposure tools that can make use of such a photopolymer composition.

The photopolymer may optionally include additional repeating units having other functional groups. For example, the copolymer may optionally include a repeating unit that adjusts some photopolymer or film property (e.g., solubility, Tg, light absorption, adhesion, surface wetting, dielectric constant, acid scavenging and the like).

Preparation and polymerization of the monomers discussed above can generally be achieved using standard synthetic methods known to a skilled artisan. Some useful examples of the preparation of orthogonal photopolymers can be found in US Publication No. 2011/0159252, PCT publication WO 2012148884, co-pending U.S. application Ser. No. 14/291,692 and U.S. provisional application 61/857,849, the entire contents of which are incorporated herein by reference. Examples of the preparation of polymers incorporating acid-catalyzed cross-linkable groups can be found in US Publication Nos. 2009/0263588, 2009/0130591 and 2002/0161068, the entire contents of which are incorporated by reference.

As mentioned above, the function of the fluorinated sensitizing dye is to absorb light and form an excited state (a photo-excited state) that is capable of sensitizing or otherwise initiating the reaction of the solubility-altering reactive group. In an embodiment, the excited state directly interacts with the solubility-altering reactive group to sensitize or otherwise initiate its reaction. In an alternative embodiment, the interaction is indirect, and the excited state of the fluorinated sensitizing dye instead interacts with a secondary material, that in turn, sensitizes or otherwise initiates the reaction of the solubility-altering reactive group. For example, the fluorinated sensitizing dye excited state may react with a photo-acid generator compound or a photo-base generator compound to thereby release an acid or base that initiates the reaction of the solubility-altering reactive group. In the present disclosure, the fluorinated sensitizing dye itself is not a photo-acid generator compound or a photo-base generator compound.

In an embodiment, the fluorinated sensitizing dye has sufficient fluorination to allow solubility in the composition of at least 0.5% by weight relative to the copolymer, preferably at least 1% and more preferably at least 2% by weight relative to the copolymer. In an embodiment, the fluorinated sensitizing dye is provided in a range of 0.5 to 15% by weight, preferably 1 to 10% by weight, and more preferably 1 to 6% by weight, relative to the copolymer. In an embodiment, the percentage of fluorine in the fluorinated sensitizing dye is at least 25% by weight, preferably at least than 30% by weight. In an embodiment, the percentage of fluorine in the fluorinated sensitizing dye is in a range of 30 to 60% by weight.

In an embodiment, the sensitizing dye has a light absorption peak in a range of 300 to 450 nm (as measured in a deposited film or in a fluorinated solvent solution). The term "light absorption peak" does not necessarily refer to the dye's wavelength of absolute maximum absorbance within the entire UV-VIS range. Rather it refers to any spectral peak within the range of 300 to 450 nm. That is, a sensitizing dye of the present disclosure may have a light absorption peak within the spectral range of 300 to 450 nm, but have a maximum (more intense) light absorption peak outside this range. Although other wavelengths outside the range of 300 to 450 nm can be used, this range is compatible with many of the photolithographic, mercury lamp exposure units available in the industry that use i-line, h-line or g-line exposures. For example, the sensitizing dye may have a light absorption peak in a range of 405 to 436 nm, and preferably, the light absorption at 405 nm is in a range of 0.33 to 3 times, preferably 0.5 to 2 times, the light absorption at 436 nm. Such a system has good sensitivity to both h-line and g-line radiation. In an embodiment, the sensitizing dye has a light absorbance of greater than 0.05, preferably greater than 0.1, at least somewhere in a range of 300 to 450 nm when the photopolymer composition is provided as a thin film.

Some non-limiting examples of useful sensitizing dye classes include dialkylaminobenzenes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, perylenes, and pyrenes. In an embodiment, the fluorinated sensitizing dye is not charged. A few non-limiting examples of fluorinated sensitizing dyes are shown below.

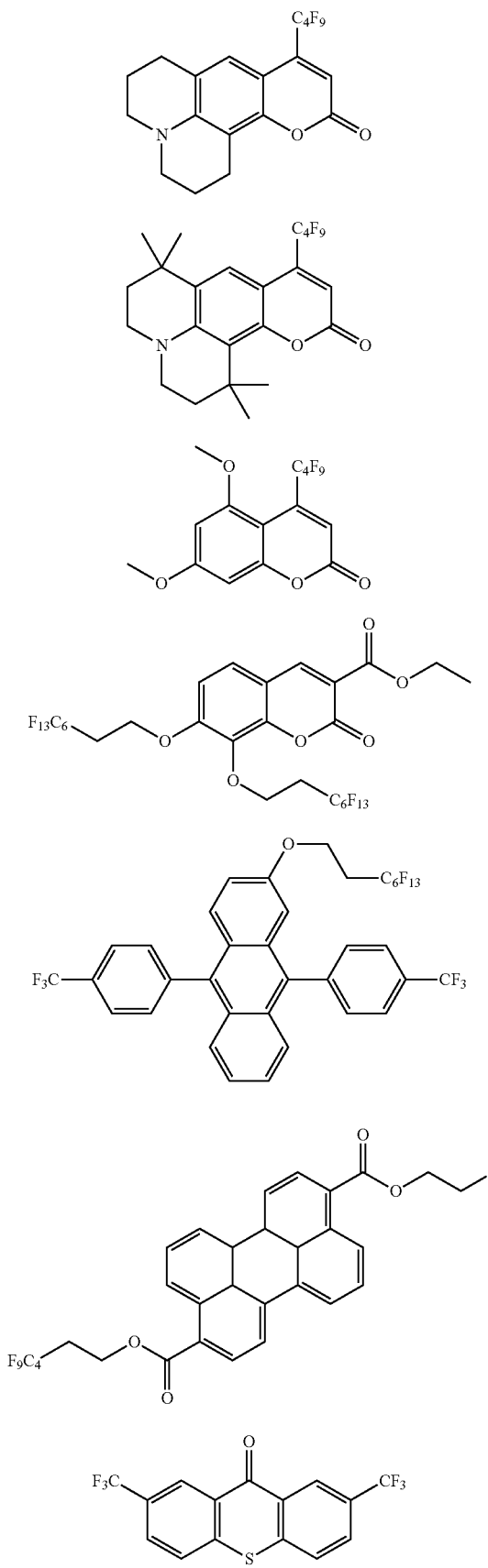
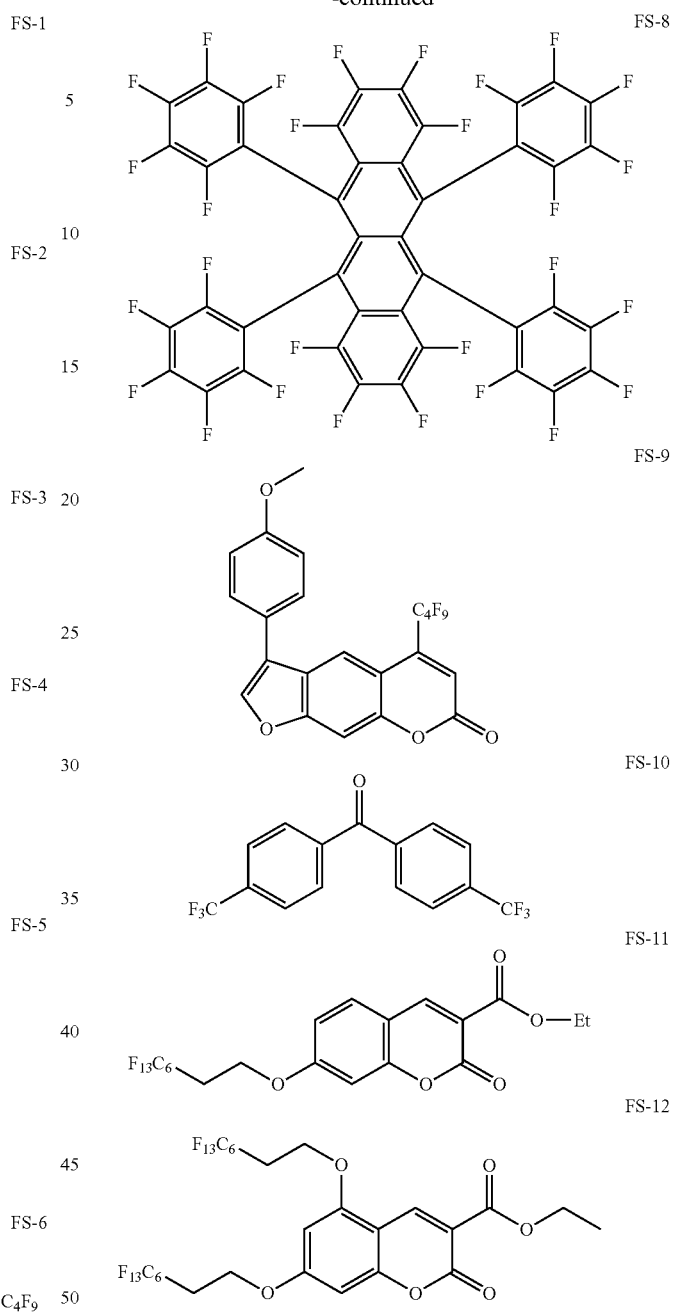

Many useful PAG compounds exist that may be added to a photopolymer composition. In the presence of proper exposure and sensitization, this photo-acid generator will liberate an acid, which will react with the second monomer portion of the fluorinated photopolymer material to transform it into a less soluble (or more soluble) form. A small molecule PAG preferably has some solubility in the coating solvent. The amount of PAG required depends upon the particular system, but generally, will be in a range of 0.1 to 6% by weight relative to the copolymer. In an embodiment, the presence of the fluorinated sensitizing dye substantially reduces the amount of PAG required relative to a composition that does not include the fluorinated sensitizing dye. In an embodiment, the amount of PAG is in a range of 0.1 to 2% by weight relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

The photosensitive composition may optionally include additives such as stabilizers, coating aids, acid scavengers ("quenchers") and the like.

The fluorinated photosensitive composition of the present disclosure may be applied to a substrate using any method suitable for depositing a photosensitive liquid material. For example, the composition may be applied by spin coating, curtain coating, bead coating, bar coating, spray coating, slot die coating, dip coating, gravure coating, ink jet, flexography or the like. The composition may be applied to form a uniform film or a patterned layer of unexposed photopolymer. Alternatively, the photopolymer can be applied to the substrate by transferring a preformed fluorinated photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

As previously mentioned, the composition of the present disclosure has many possible uses. Many of the uses may involve photopatterning. A flow diagram for a photopatterning embodiment of the present invention is shown in FIG. 1, and includes the step 2 of forming a photopolymer layer on a substrate. The substrate may optionally be a multilayer structure having a rigid or flexible support and one or more additional patterned or non-patterned layers. In an embodiment, the top of the substrate includes a layer of active organic material that is in contact with the photopolymer layer, either directly or via diffusion of a component of the photopolymer composition.

In step 4, the photopolymer layer is exposed to patterned radiation within the spectral sensitivity range of the sensitizing dye (e.g., light in a range of 300 nm to 450 nm), thereby forming an exposed photopolymer layer. The patterned radiation forms areas of differential developability due to some chemical or physical change caused by the radiation exposure, in particular, to the reacted solubility-altering reactive groups. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation. Alternatively, the patterned light can be produced by a projection exposure device. In addition, the patterned light can be from a laser source that is selectively directed to certain portions of the photopolymer layer.

In step 6, a developed structure is formed that includes a first pattern of photopolymer. This can be done by contacting the exposed photopolymer layer with a developing agent. During development, a portion of the exposed photopolymer layer is removed in accordance with the patterned light. Depending on the nature of the chemical or physical change caused by the patterned light and choice of developing agent, the developing agent may dissolve the unexposed portion (negative working resist) or it may dissolve the exposed portion (positive working resist). In either case, it leaves behind a developed structure having a first pattern of photopolymer that covers the substrate and a complementary second pattern of uncovered substrate corresponding to the removed portion of photopolymer. By uncovered substrate, it is meant that the surface of the substrate is substantially exposed or revealed to a degree that it may optionally be subjected to further treatments. Contacting the exposed photopolymer layer can be accomplished by immersion into the developing agent or by coating it with the developing agent in some way, e.g., by spin coating or spray coating. The contacting can be performed multiple times if necessary. Although formation of the developed structure could be the last patterning step if the photopolymer layer is intended to remain in the device, the developed structure may be subjected to further steps as described below. In an embodiment, the developing agent includes at least 50% by volume of a fluorinated solvent, e.g., an HFE solvent.

The developed structure may optionally be subjected to further treatments, depending on the nature of the device. For example, the structure may be treated to etch a portion of the uncovered substrate (wherein the photopolymer acts as an etch barrier), treated to modify a property of the uncovered substrate or photopolymer, coated with an additional material layer, contacted with a stripping solvent to remove the first pattern photopolymer, and the like. Some non-limiting examples of such further treatments can be found in co-pending U.S. application Ser. No. 14/291,692, the entire contents of which are incorporated herein by reference.

In an embodiment, the fluorinated photopolymer of the present disclosure may be used as a photoresist, but as described above, there are many possible alternative uses. Some non-limiting examples are described below.

In an embodiment, the fluorinated photopolymer of the present disclosure may be used as an electrically insulating layer in an electronic device. For example, it may act as an insulating layer in a wire, a TFT structure, a touch screen, an RFID device, a sensor, a capacitor, a photovoltaic device and the like.

In an embodiment, the present fluorinated photopolymer may be used as a partition structure that separates light-emitting areas of a display or lighting device, e.g., as described in U.S. Pat. No. 6,693,296 or in U.S. Pat. No. 5,701,055, the entire contents of both patents are incorporated by reference herein. Some examples of useful light-emitting materials include organic light-emitting materials, such as those used in OLED devices, and semiconductor nanoparticles, such as quantum dots formed from colloidal semiconductor nanocrystals, particularly III/V or II/VI semiconductors.

In an embodiment, the present fluorinated photopolymer may be patterned to form a plurality of wells that may be used for many possible purposes, e.g., wells that are capable of containing a display material. For example, the fluorinated photopolymer may form banks and wells as described in US 2005/0196969, the entire contents of which are incorporated by reference, wherein the wells are filled with a solution-based organic light emitting material. Such filling can optionally be by ink jet. Other display materials may be added include liquid crystal material, electrophoretic material, a semiconductor nanoparticle material, a color filter material, and the like.

In an embodiment, the present fluorinated photopolymer may be used to form at least a portion of a barrier layer in a water- or solvent-sensitive device. Organic semiconductors and organic light-emitting materials in particular are often very sensitive to water. A barrier layer can be coated over a device as a single layer or as multiple layers and may optionally be part of an alternating photopolymer/inorganic oxide multilayer barrier structure. Similarly, a bioelectronic device such as a biosensor, an ion pump, an electrochemical transistor, a drug delivery device and the like may use the present fluorinated photopolymer as one or more structural or barrier layers. In some embodiments, e.g., implantable bioelectronic devices, an outer coating may be particularly beneficial.

EXAMPLES

Copolymer 1

A copolymer solution was formed from the polymerization of: 1H,1H,2H,2H-perfluorooctyl methacrylate ("FOMA") as a first monomer and t-butylmethacrylate ("TBMA") as a second monomer. The relative ratio of the two monomers was approximately 50/50 mol %, respectively, and the polymerization was carried out in a hydrofluoroether solvent. The following procedure can be used to prepare Copolymer 1.

A clean, dry 1 L four-neck jacketed reactor was equipped with a Teflon-blade mechanical stirrer, a reflux condenser having a mineral oil bubbler, a nitrogen inlet (the height of which could be adjusted to be below the surface of the reaction solution), and a programmable constant temperature bath (CTB) attached to the reactor jacket. To the reactor was charged FOMA (165.2 g, 0.382 mol), TBMA (55.1 g, 0.387 mol), AIBN (4.40 g, 0.0268 mol) and Novec™7600 solvent (437.5 g). The nitrogen inlet was placed below the surface of the solution, and with good stirring, the reaction solution was sparged with nitrogen for 1 h. During the nitrogen sparge, the CTB was pre-warmed to 78° C. with the flow to the reactor jacket turned off. When the sparge was complete, the gas inlet tube was raised above the solution level and the nitrogen flow was reduced to maintain a slow flow through the system during the reaction. The valves between the pre-heated CTB and the reactor were opened and the reaction solution was stirred with heating for 18 h. The CTB was set to 21° C., and when the polymer solution was cooled, a total of 1178 g of Novec™7600 was added to the polymer solution to rinse it out of the reactor and to achieve a suitable viscosity for coating operations.

Copolymer 2

A mixture of 216.60 g (0.501 moles) FOMA, 18.20 (0.128 moles) glycidyl methacrylate ("GMA"), and 4.702 g (0.0245 moles) 2-2'-azobis(2-methylbutyronitrile) in 685 g HFE-7600 was stirred under nitrogen for 18 hrs at 78° C., then cooled to room temperature The reaction contents were drained, and the residue rinsed out with 1036.26 g additional Novec™ 7600 in three portions. The combined solutions provided a solution of the photopolymer containing 12 w/w % solids. The FOMA/GMA molar ratio was 79.7/20.3.

Copolymer 3

Using similar equipment to make copolymer 1, copolymer 3 was prepared from FOMA (240.0 g, 0.555 mol), TBMA (47.5 g, 0.334 mol), 2-(trimethylsilyloxy)ethyl methacrylate ("TMSOEMA" 45.0 g, 0.222 mol), AIBN (6.60 g, 0.0402 mol) and Novec™ 7600 solvent (657.6 g). In this example the FOMA/TBMA/TMSOEMA monomer ratios were approximately 50/30/20 respectively. TMSOEMA includes an alcohol-forming precursor group. The reaction temperature was 80° C. and the reaction time was 18 hours. After cooling the reaction mixture to ambient, a total of 1557.6 g of Novec™ 7600 was added to the polymer solution to rinse it out of the reactor and to achieve a suitable viscosity for coating operations.

Synthesis of
5,7-dimethoxy-4-heptafluorobutylcoumarin (FS-3)

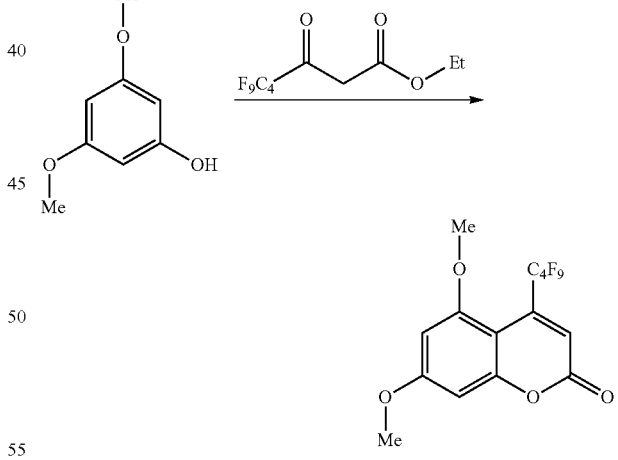

The intermediate ethyl nonafluorovaleroylacetate was synthesized according to the procedure of U.S. Pat. No. 4,647,689. A mixture of 3,5-dimethoxyphenol (2.10 g, 14 mmol), ethyl nonafluorovaleroylacetate (5.69 g, 17 mmol), zinc chloride (2.9 g, 21 mmol), and 20 mL absolute ethanol was heated at reflux under nitrogen for 3 d. The reaction mixture was cooled to ambient and poured into aqueous HCl (1.2 M, 50 mL). The product was extracted into dichloromethane, and the extracting solution was washed with brine, dried (MgSO$_4$) and concentrated under reduced pressure. The product was purified by column chromatography on silica gel, eluting with a mixture of heptane and dichloromethane. The product was obtained as 0.25 g (4%) of a white solid. The product was characterized by $^1$H NMR: (300 MHz, CDCl$_3$) δ 3.86 (s, 3H), 3.88 (s, 3H), 6.37 (d, 1H), 6.52 (d, 1H), 6.62 (s, 1H). FS-3 has a fluorine content of 39.5% by weight.

Synthesis of ethyl 7,8-di(2H,2H,3H,3H-perfluorooctyloxy)coumarin-3-carboxylate (FS-4)

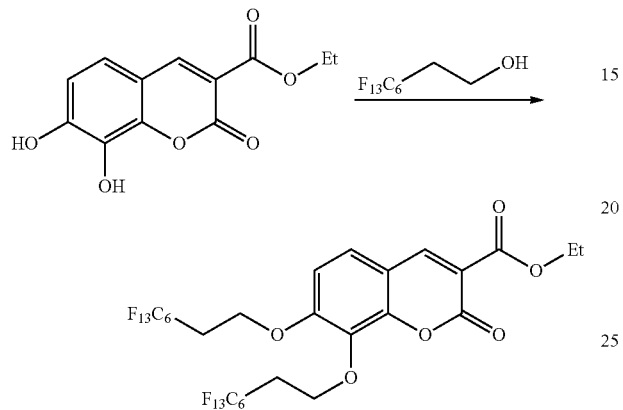

The intermediate ethyl 7,8-dihydroxycoumarin-3-carboxylate was prepared according to the procedure of Alvim, et al. (*J. Braz. Chem. Soc.* 2005, 16, 763). A stirred mixture of ethyl 7,8-dihydroxycoumarin-3-carboxylate (1.00 g, 4 mmol), triphenyl phosphine (2.31 g, 9 mmol), and 5 mL of dry tetrahydrofuran under nitrogen was treated successively with diisopropylazodicarboxylate (1.78 g, 9 mmol) in 6 mL of tetrahydrofuran and perfluorohexylethyl alcohol (3.20 g, 9 mmol) in 6 mL of tetrahydrofuran. The resulting mixture was stirred 18 h at ambient temperature, then concentrated. Diethyl ether (25 mL) was added, and the resulting precipitate was filtered away. The filtrate was concentrated, and the resulting paste was extracted with methyl nonafluorobutyl ether. The combined extracts were concentrated to deposit a light yellow solid. The product was purified by column chromatography of silica gel, eluting with a mixture of heptane and dichloromethane, followed by recrystallization from ethanol. The product was obtained as 0.29 g (7%) of a white solid. The product was characterized by $^1$H NMR: (300 MHz, CDCl$_3$) δ 1.41 (t, 3H), 2.7 (m, 4H), 4.4 (m, 6H), 6.93 (d, 1H), 7.36 (d, 1H), 8.48 (s, 1H). FS-4 has a fluorine content of 50.8% by weight.

Synthesis of 2-methoxy-9,10-bis(4-trifluoromethylphenyl)anthracene

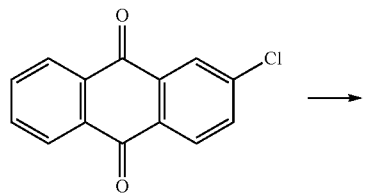

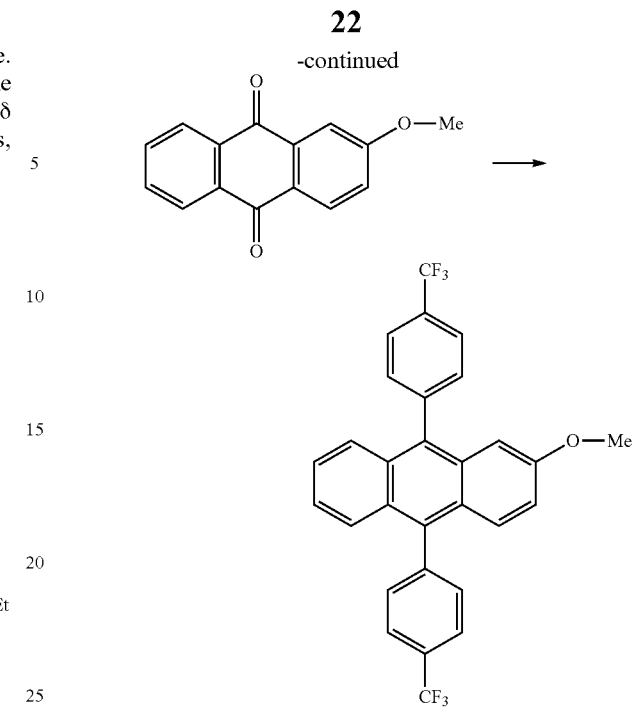

First, the intermediate 2-methoxy-9,10-anthraquinone was prepared. A solution of 2-chloro-9,10-anthraquinone (10.08 g, 42 mmol) in 100 mL of N,N-dimethylformamide was treated with 25 mL of 25% sodium methoxide in methanol. The stirred reaction mixture was heated in a 120° C. oil bath for 6 h under nitrogen, then cooled to ambient. The product was precipitated into aqueous HCl (0.5 M, 250 mL), collected, washed with water and dried. The product was purified by recrystallization from a mixture of toluene and heptane to provide 1.6 g (16%) of a light yellow solid. This intermediate was characterized by $^1$H NMR: (300 MHz, CDCl$_3$) δ 4.00 (s, 3H), 7.28 (d, 1H), 7.29 (d, 1H), 7.70 (m, 2H), 8.26 (s, 1H), 8.30 (m, 2H).

A suspension of magnesium (0.60 g, 25 mmol) in 10 mL of dry tetrahydrofuran was treated dropwise with a solution of 4-trifluoromethylbromobenzene (5.55 g, 25 mmol) in 25 mL of tetrahydrofuran. Once the initial exotherm had subsided, the mixture was heated at reflux for 20 min. The resulting solution was cooled in an ice bath, and a slurry of 2-methoxy-9,10-anthraquinone (2.80 g, 12 mmol) in 60 mL of tetrahydrofuran was added. The ice bath was removed, the mixture was heated at reflux 60 min and then cooled to ambient. Aqueous HCl (0.5 M, 100 mL) was added, and the product was extracted with dichloromethane. The extract was dried (MgSO$_4$) and concentrated to deposit an orange solid. To this solid was added potassium iodide (3.90 g, 47 mmol), sodium hypophosphite hydrate (4.98 g, 47 mmol), and 25 mL of acetic acid. This stirred mixture was heated at reflux for 2 h, then cooled to ambient and diluted with 200 mL of water. The resulting precipitate was collected, washed with water, and dried. The product was purified by column chromatography on silica gel, eluting with a mixture of heptane and dichloromethane to afford 0.68 g (12%) of a light yellow solid. The product was characterized by $^1$H NMR: (300 MHz, CDCl$_3$) δ 3.70 (s, 3H), 6.72 (d, 1H), 7.08 (dd, 1H), 7.32 (m, 2H), 7.50-7.65 (m, 7H), 7.88 (m, 4H). 2-Methoxy-9,10-bis(4-trifluoromethylphenyl)anthracene has a fluorine content of 23.0% by weight.

Synthesis of 2-(perfluorohexylethyloxy)-9,10-bis(4-trifluoromethylphenyl)anthracene (FS-5)

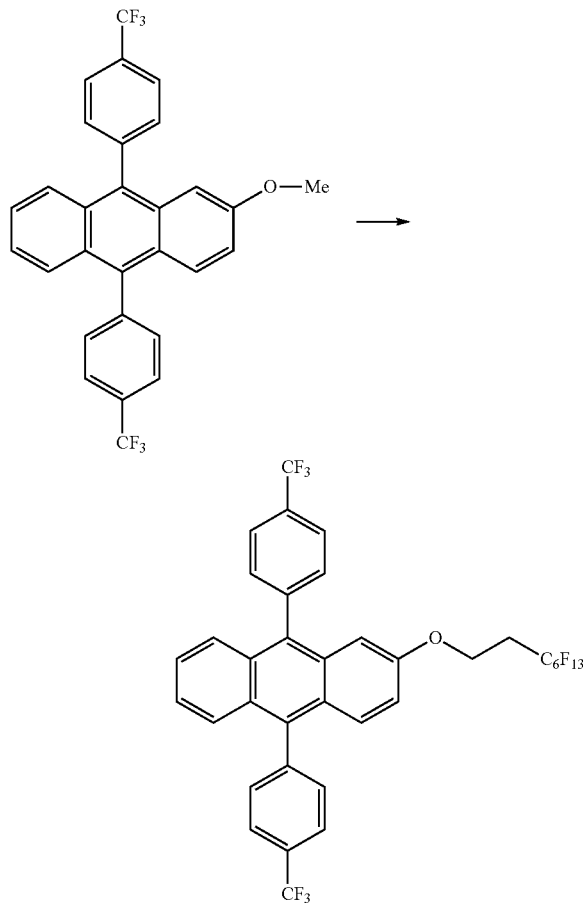

A stirred solution of 2-methoxy-9,10-bis(4-trifluoromethylphenyl)anthracene (0.27 g, 0.5 mmol) and perfluorohexylethyl alcohol (0.40 g, 1.1 mmol) in 40 mL of toluene was treated with 0.08 g (0.5 mmol) of trifluoromethylsulfonic acid, and then heated at reflux for 24 h. The dark mixture was cooled and concentrated to deposit a crude product. The product was purified by column chromatography on silica gel, eluting with a mixture of heptane and dichloromethane to afford 0.11 g (24%) of a light yellow solid. The product was characterized by $^1$H NMR: (300 MHz, CDCl$_3$) δ 2.6 (m, 2H), 4.18 (t, 2H), 6.75 (d, 1H), 7.06 (dd, 1H), 7.35 (m, 2H), 7.55-7.63 (m, 7H), 7.90 (m, 4H). FS-5 has a fluorine content of 42.8% by weight.

Synthesis of 9-(nonafluorobutyl)-1H,5H,11H-[1]benzopyrano[6,7,8-ij]quinolizin-11-one (FS-1)

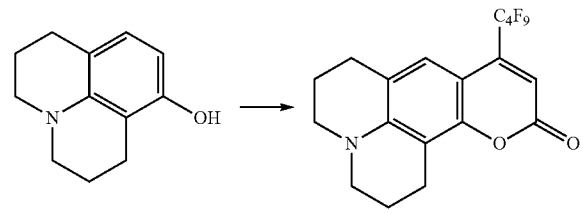

A stirred mixture of 8-hydroxyjulolidine (2.63 g, 14 mmol), ethyl nonafluorovaleroylacetate (5.11 g, 15 mmol), absolute ethanol (20 mL) and five drops of piperidine was heated at reflux for 4 d. The mixture was cooled to ambient and concentrated to deposit a paste. The paste was taken up in dichloromethane and this solution was passed through a short column of silica gel. The eluate was concentrated, and the residue was triturated with hexanes and cooled 18 h to deposit a crystalline solid. The product was purified by successive recrystallizations from hexanes and from 9:1 methanol:water to provide 1.04 g (16%) of a yellow solid. The product was characterized by $^1$H NMR: (300 MHz, CDCl$_3$) δ 1.97 (m, 4H), 2.7-2.9 (m, 4H), 3.33. (m, 4H), 6.28 (s, 1H), 7.10 (s, 1H). FS-1 has a fluorine content of 36.5% by weight.

Synthesis of 2,3,6,7-tetrahydro-1,1,7,7-tetramethyl-9-(heptafluorobutyl)-1H,5H,11H-[1]benzopyrano[6,7,8-ij]quinolizin-11-one (FS-2)

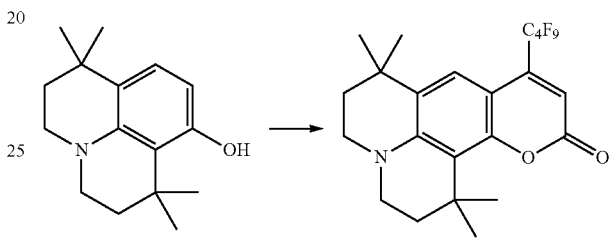

First, the intermediate 2,3,6,7-tetrahydro-1,1,7,7-tetramethyl-1H,5H-benzo[ij]quinolizin-8-ol was prepared according to the procedure of U.S. Pat. No. 4,736,032. A stirred mixture of 2,3,6,7-tetrahydro-1,1,7,7-tetramethyl-1H,5H-benzo[ij]quinolizin-8-ol (2.4 g, 9.8 mmol), ethyl nonafluorovaleroylacetate (4.09 g, 12 mmol), absolute ethanol (25 mL) and five drops of piperidine was heated at reflux for 4 d. An additional charge of ethyl nonafluorovaleroylacetate (1.75 g, 5 mmol) and piperidine (5 drops) was added and the reaction continued 2 d more. Acetic acid (5 drops) was added, and the reaction continued for 3 d. The mixture was cooled to ambient and concentrated to dryness. The residue was dissolved in a small amount of methanol and stored at −17° C. for several days to crystallize the product. The solid was collected and further recrystallized from methanol to provide 0.57 g (11%) of the product as an orange solid. The product was characterized by $^1$H NMR: (300 MHz, CDCl$_3$) δ 1.27 (s, 6H), 1.54 (s, 6H), 1.8 (m, 4H), 3.2-3.35 (m, 4H), 6.30 (s, 1H), 7.38 (s, 1H). FS-2 has a fluorine content of 32.6% by weight.

Synthesis of ethyl 5,7-di(2H,2H,3H,3H-perfluorooctyloxy)coumarin-3-carboxylate (FS-12)

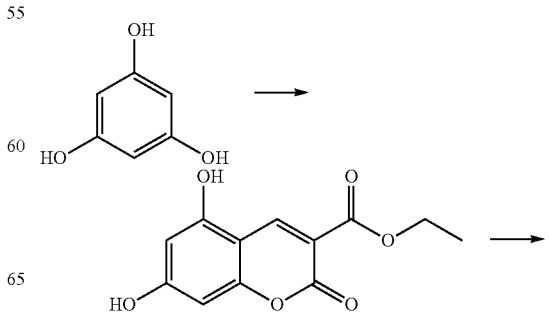

-continued

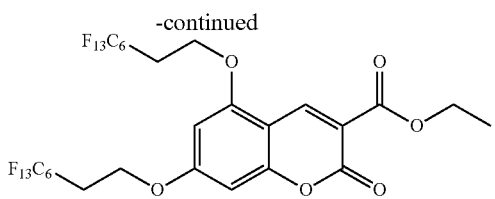

First, Ethyl 5,7-dihydroxy-3-coumarincarboxylate was prepared. A stirred mixture of phlorglucinol (6.57 g, 52 mmol), diethyl ethoxymethylenemalonate (12.39 g, 5.7 mmol), and 50 mL of absolute ethanol was treated with zinc chloride (8.88 g, 65 mmol) and heated under nitrogen at reflux for 22 h. After cooling to ambient, the reaction mixture was poured into 100 mL of 0.1 M aqueous hydrochloric acid. The precipitate was collected, washed with water, and dried to afford 1.60 g (12% of theory) of the desired intermediate product as a red solid. Next, to a mixture of ethyl 5,7-dihydroxy-3-coumarincarboxylate (1.60 g, 6.4 mmol), cesium carbonate (6.25 g, 13 mmol), and 30 mL of acetonitrile was added 1,1,1,2,2,3,3,4,4,5,5,6,6-tridecafluoro-8-(trifluoromethylsulfonyloxy)octane (6.25 g, 19 mmol, prepared by the method of Koshti et al., *Synthetic Communications* 2002, 32, 3779, and purified by distillation at reduced pressure). The mixture was heated at reflux 18 h, cooled to ambient, diluted with dichloromethane, filtered, and concentrated. The residue was recrystallized from acetonitrile to afford 2.94 g (49% of theory) of the product as a yellow solid.

Photopatterning Evaluation

Samples for photopatterning evaluation were prepared by combining the copolymer solution of interest with an appropriate type and level of fluorinated sensitizing dye and PAG, as summarized in Table 1 below. Percentages of sensitizing dye and PAG are in weight percent relative to the copolymer. The PAG was CGI 1907 (2-[2,2,3,3,4,4,5,5-octafluoro-1-(nonafluorobutylsulfonyloxyimino)-pentyl]-fluorene). The prepared samples were typically filtered through a Mykrolis Optimizer filter with a pore size of 0.05 μm filter.

A silicon wafer was primed by vapor depositing HMDS. Each fluorinated photopolymer solution was spin coated onto the silicon wafer and then "soft baked" at 90° C. for 60 seconds. The photopolymer layer was about 1.0 to 1.5 μm thick. The photopolymer was exposed through a reticle to patterned radiation, either with "i-line" @ 365 nm with doses ranging from 40 mJ/cm² to 880 mJ/cm² or with or "g-line" @ 436 nm with doses ranging from 50 mJ/cm² to 700 mJ/cm². This was followed by post-exposure baking at 90° C. for 60 seconds. The exposed photopolymer was then developed to remove the unexposed portion and to form a photopolymer pattern on the substrate. The developing agent composition, the number of applications of developer (approximately 10 mL each) provided onto the photopolymer layer to form a "puddle," and the dwell time of each application are all shown in Table 2. The wafer was spun dry at the end of each dwell time and the lithographic performance was evaluated, as shown in Table 1. In particular, the minimum dose to form a useful image was evaluated for each sample. The term "useful image" refers to the ability to form ~5 micron lines for the i-line exposure samples. The mask used for g-line exposures was different and not as conducive to precise quantification. In the case of Example 6, an image is clearly forming above 63 mJ/cm², but it may not be strong enough at that exposure to be of practical use. It was clear, however, that one does not have to go far above this level to form a useful image—certainly far less than 700 mJ/cm².

TABLE 1

| Sample | Copolymer | Sensitizing dye | Dye % | PAG % | Exposure | Minimum dose to form useful image (mJ/cm²) |
| --- | --- | --- | --- | --- | --- | --- |
| Comp. 1 | 1 | none | 0 | 1 | i-line | 194 |
| Example 1 | 1 | FS-4 | 2 | 1 | i-line | 166 |
| Example 2 | 1 | FS-3 | 2 | 1 | i-line | 110 |
| Comp. 2 | 2 | None | 0 | 1 | i-line | >880 (no image formed) |
| Example 3 | 2 | FS-4 | 2 | 1 | i-line | 593 |
| Example 4 | 2 | FS-3 | 2 | 1 | i-line | 229 |
| Example 5 | 2 | FS-5 | 2 | 1 | i-line | 600 |
| Comp. 3 | 3 | None | 0 | 3 | g-line | >700 (no image formed) |
| Example 6 | 3 | FS-1 | 5 | 3 | g-line | 63 < min dose << 700 |
| Example 7 | 3 | FS-2 | 5 | 3 | g-line | <50 |

TABLE 2

| Sample | Developer | # puddles | Time for each puddle (s) |
| --- | --- | --- | --- |
| Comp. 1 | HFE 7300 | 2 | 60 |
| Example 1 | HFE 7300 | 2 | 60 |
| Example 2 | HFE 7300 | 2 | 60 |
| Comp. 2 | HFE 7300/HFE 7600 97%/3% by volume | 2 | 45 |
| Example 3 | HFE 7300/HFE 7600 97%/3% by volume | 2 | 45 |
| Example 4 | HFE 7300/HFE 7600 97%/3% by volume | 2 | 45 |
| Example 5 | HFE 7300/HFE 7600 97%/3% by volume | 2 | 45 |
| Comp. 3 | HFE 7300 | 1 | 40 |
| Example 6 | HFE 7300 | 2 | 15 |
| Example 7 | HFE 7300 | 4 | 15 |

From the data in Table 1 it is clear that the examples having the fluorinated sensitizing dye were more photoefficient than the comparison photopolymers without the sensitizing dye. One can tune the exposure wavelength sensitivity by choice of the sensitizing dye. It should be pointed out that some fluorinated sensitizing dyes with low fluorine content were ineffective. For example, 2-methoxy-9,10-bis(4-trifluoromethylphenyl)anthracene (having a fluorine content of 23% by weight) had insufficient solubility in these hydrofluoroether solvents.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step

The invention claimed is:
1. A photosensitive composition comprising:
a fluorinated solvent;
a fluorinated sensitizing dye having a fluorine content in a range of 30 to 60% by weight; and
a copolymer comprising at least two distinct repeating units, including a first repeating unit having a fluorine- containing group and a second repeating unit having a solubility-altering reactive group.

2. The photosensitive composition of claim 1 further comprising a non-ionic photo-acid generator compound.

3. The photosensitive composition of claim 1 wherein the solubility-altering reactive group is a cross-linkable group.

4. The photosensitive composition of claim 1 wherein the solubility-altering reactive group is an acid-forming precursor group.

5. The photosensitive composition of claim 1 wherein the solubility-altering reactive group is an alcohol-forming precursor group.

6. The photosensitive composition of claim 1 wherein the copolymer has a total fluorine content in a range of 15 to 60% by weight.

7. The photosensitive composition of claim 1 wherein the sensitizing dye has a total fluorine content in a range of 25 to 60% by weight.

8. The photosensitive composition of claim 7 wherein the sensitizing dye includes a fluorine-containing alkyl group.

9. The photosensitive composition of claim 7 wherein the sensitizing dye has a light absorption peak in a range of 300 to 450 nm.

10. The photosensitive composition of claim 1 wherein the solvent is a hydrofluoroether.

11. A method of patterning a device, comprising:
    forming a photopolymer layer on a device substrate, the photopolymer layer including a fluorinated sensitizing dye and a copolymer, wherein the fluorinated sensitizing dye has a fluorine content in a range of 30 to 60% by weight and the copolymer comprises at least two distinct repeating units, including a first repeating unit having a fluorine-containing group and a second repeating unit having a solubility-altering reactive group, wherein the total fluorine content of the copolymer is in a range of 15 to 60% by weight;
    exposing the photopolymer layer to patterned light in a wavelength range of 300 to 450 nm to form an exposed photopolymer layer; and
    contacting the exposed photopolymer layer with a developing agent to remove a portion of the exposed photopolymer layer in accordance with the patterned light, thereby forming a developed structure having a first pattern of photopolymer covering the substrate and a complementary second pattern of uncovered substrate corresponding to the removed portion of photopolymer, the developing agent comprising at least 50% by volume of a fluorinated solvent.

12. The method of claim 11 wherein the fluorinated solvent is a hydrofluoroether.

13. The method of claim 12 wherein the substrate comprises a support and a layer of active organic material, and wherein the photopolymer layer is in contact with the layer of active organic material.

14. The method of claim 11 wherein the total fluorine content of the copolymer is in a range of 30 to 60% by weight.

15. The method of claim 11 wherein the sensitizing dye has a total fluorine content in a range of 25 to 60% by weight.

16. The method of claim 1 wherein the photopolymer layer further comprises a non-ionic photo-acid generator compound.

17. The method of claim 1 wherein the solubility-altering reactive group is a cross-linkable group.

18. The method of claim 1 wherein the solubility-altering reactive group is an acid-forming precursor group.

19. The method of claim 1 wherein the solubility-altering reactive group is an alcohol-forming precursor group.

* * * * *